United States Patent
Kang et al.

(10) Patent No.: US 6,911,286 B2
(45) Date of Patent: Jun. 28, 2005

(54) METHOD OF DESIGNING PHASE GRATING PATTERN PROVIDING MODIFIED ILLUMINATION OPTIMUM FOR PRODUCING A TARGET PATTERN AND METHOD OF MANUFACTURING A PHOTO MASK SYSTEM COMPRISING THE PHASE GRATING PATTERN

(75) Inventors: Young-Seog Kang, Yongin (KR); Jong-Rak Park, Cheongju (KR)

(73) Assignee: Samsung Electronics Co., Ltd., Suwon-si (KR)

(*) Notice: Subject to any disclaimer, the term of this patent is extended or adjusted under 35 U.S.C. 154(b) by 260 days.

(21) Appl. No.: 10/409,163

(22) Filed: Apr. 9, 2003

(65) Prior Publication Data

US 2004/0013950 A1 Jan. 22, 2004

(30) Foreign Application Priority Data

Jul. 18, 2002 (KR) .................... 10-2002-0041976

(51) Int. Cl.[7] .................................................. G01F 9/00
(52) U.S. Cl. .......................................................... 430/5
(58) Field of Search .......................... 430/5, 322, 323, 430/324; 716/19

(56) References Cited

U.S. PATENT DOCUMENTS 6,037,082 A * 3/2000 Capodieci .................... 430/5

* cited by examiner

*Primary Examiner*—S. Rosasco
(74) *Attorney, Agent, or Firm*—Volentine Francos & Whitt, PLLC

(57) ABSTRACT

A method of designing a phase grating pattern provides a modified form of illumination for a main mask, optimum for producing one or more target patterns on a wafer in a photolithographic process. Once the target pattern(s) to be formed on the wafer are decided, an area to be occupied by at least a portion of the phase grating is divided into a plurality of subcells, initial phase values are assigned to each of the subcells, and one of the subcells is randomly selected and the phase value last assigned thereto is changed, and the process is repeated. The process is in an iteration that changes the arrangement of the phase values assigned to the subcells until they converge on one which will provide the design for a phase grating which will produce a modified form of illumination optimum for use in forming the target pattern(s) on the wafer.

20 Claims, 5 Drawing Sheets

METHOD OF DESIGNING PHASE GRATING PATTERN PROVIDING MODIFIED ILLUMINATION OPTIMUM FOR PRODUCING A TARGET PATTERN AND METHOD OF MANUFACTURING A PHOTO MASK SYSTEM COMPRISING THE PHASE GRATING PATTERN

BACKGROUND OF THE INVENTION

1. Field of the Invention

The present invention relates to a photolithographic process used in semiconductor manufacturing. More particularly, the present invention relates to a phase grating pattern used to produce modified illumination in a photo mask system and to a method of manufacturing a photo mask system having the phase grating pattern.

2. Description of the Related Art

A photolithographic process is used extensively to transfer pattern images in the manufacturing of semiconductor devices. However, the resolution of the photolithographic process must be increased to meet the current demand for semiconductor devices having higher and higher integration densities, i.e., to meet the demand for manufacturing semiconductor devices produced under smaller and smaller design rules. The resolution of the photolithographic process may be limited by several factors, such as the wavelength of an exposure light source, the numerical aperture of a projection lens, the depth of focus, the process parameters, and the like. The need to increase the resolution of the photolithographic process, however, surpasses the limitations of current exposure apparatus.

Attempts to overcome the limitations imposed by exposure apparatus on the resolution that can be achieved in a photolithographic process have included modifying the illumination systems of the apparatus and the introduction of phase shift masks. With respect to the latter, a grating has been added to a primary mask to diffract light transmitted through the primary mask, thereby modifying the illumination otherwise provided for the exposure process. Such grating-diffracted light causes a shift in the exposure energy illuminating the primary mask to provide an off-axis illumination of the primary mask. The resolution that is otherwise achievable using only the primary mask can thus be improved.

Such gratings up until now have been limited to simple line-space or simple mosaic types of gratings. For example, U.S. Pat. No. 6,057,065, issued May 2, 2000 to J. Brett Rolson, and entitled "Lithographic System Having Diffraction Grating and Attenuated Phase Shifters", discloses simple line-space grating patterns. Such grating patterns are basically composed of simple line-space or square mosaic forms of patterns and are thus limited to providing modified illumination corresponding to a simple dipole or quadrupole. Simple dipole or quadrupole modified illumination can only achieve a limited increase in the resolution of the photolithographic process.

In addition, only one modified form of illumination is practical for each mask in the conventional technique of providing a phase grating pattern. However, a semiconductor circuit which is to be fabricated using such modified illumination is typically a combination of various wiring patterns. Thus, although one form of modified illumination may be optimum for use in producing some of the wiring patterns of the semiconductor circuit, the same modified illumination may be not optimum for use in producing other patterns constituting the same circuit. In other words, the simple form of the modified illumination possible with the prior art cannot be optimum for use in producing all of the patterns of the same semiconductor circuit.

Accordingly, in actual practice, an optical proximity correction (OPC) or a multi-exposure technique is performed to compensate for the poor exposure of those regions by light that was not optimal for their exposure despite being directed through a primary mask and a phase grating pattern for modifying the illumination of the primary mask. However, these techniques significantly increase the time and cost of carrying out the photolithography process. In addition, it is difficult to realize a pattern transition corresponding to a desired target pattern even when these additional compensation techniques are performed.

SUMMARY OF THE INVENTION

An object of the present invention is to provide a method of designing a phase grating pattern by which the illumination of a primary mask can be modified in order to increase the resolution of a photolithographic process in which the main pattern of the primary mask is transcribed onto a wafer.

According to one aspect of the present invention, a method of designing a phase grating pattern first involves deciding upon a target pattern to be formed on the wafer via photolithography. An area, over which at least a portion of the phase grating pattern will be realized, is established. This area is divided into a plurality of subcells. Phase values are initially assigned to each of the subcells. Each of the phase values represents a respective phase shift that exposure light of the photolithographic process will undergo by being transmitted through a region of the phase grating pattern corresponding to the subcell. Next, one of the subcells is selected and the phase value of the selected cell is changed. This process is repeated to produce various arrangements of the phase values assigned to the subcells. The arrangement of the phase values are evaluated to determine a design for a corresponding phase grating that will provide a modified form of illumination optimum for use in forming the target patterns on the wafer.

Preferably, the phase grating pattern is designed for a unit region, and is repeated to produce the phase grating. Also, the method may entail designing for several different types of target patterns to be formed on the wafer. In this case, the process is sequentially performed to obtain arrangements of phase values corresponding to the regions of the wafer on which the different target patterns are to be formed. The phase grating patterns, designed on the basis of the arrangements of the phase values, are combined to produce a phase grating that can be used with just one mask to produce the different target patterns.

The initial phase values may be randomly assigned to the subcells or the same initial phase value may be initially assigned to all of the subcells. As an example, the phase values may be selected from a group consisting of 0° and 180°. When the phase value of a selected subcell is changed, the new phase value is preferably selected from among those/that which areas different from the existing phase value.

The evaluating of the arrangements of the phase values includes obtaining a model of the modified form of illumination that a phase grating pattern based on the arrangement of the phase values will produce, and evaluating whether an aerial image of the wafer, produced via a photolithographic process that employs the modified illumination, corresponds to the image of the target pattern(s) to be formed on the wafer. The aerial image of the wafer may be obtained as a defocused image.

According to the aspect of the present invention, the phase values are evaluated using a Fourier-transformed function based on the arrangement of the phase values which are assigned to the subcells. In this case, a Fourier-transform function is used to obtain a Fourier-transform function value representative of the form of modified illumination that will be produced by a phase grating pattern based on the new arrangement of phase values that are assigned to the subcells. Then, an aerial image of the wafer is obtained. The aerial image may be a simulation of what the wafer would look like upon undergoing a photolithographic process using the form of the modified illumination represented by the Fourier-transform function value. Preferably, the aerial image is obtained as a defocused image.

Next, a cost function value representing a difference between the aerial image and the target pattern to be formed on the wafer is obtained. The cost function value is evaluated to determine whether the modified form of the illumination corresponds to the target pattern. As is clear form the above-described first aspect of the present invention, these steps are repeated until a phase grating pattern, based on the arrangement of the phase values, is determined to provide the modified illumination that can be used to form the target pattern(s) on the wafer.

As the steps in the design process are repeated, the current cost function value is compared to the previous cost function value. The assignment of the new phase value to the selected one of the subcells is maintained throughout the remainder of the process if the current cost function value is less than the previous cost function value. On the other hand, the phase value assigned to the selected one of the subcells is changed back to the phase value previously assigned to the selected one of the subcells if the current cost function value is greater than the previous cost function value. Thus, the method is one of an iteration in which the cost function value converges toward a prescribed value, representing the number of times the steps must be repeated to establish an arrangement of phase values that correspond to a phase grating which will produce the intended modified illumination.

According to a still another aspect of the present invention, a method of manufacturing a photo mask includes selecting a target pattern(s) to be produced on the wafer via photolithography, providing a primary mask bearing a main pattern the image of which is to be transcribed onto the wafer in the photolithographic process aimed at producing the target pattern(s), designing a phase grating pattern according to the above-described aspect(s) of the invention, and producing a mask system in which the designed phase grating pattern is integrated with the primary mask.

The phase grating pattern may be formed on a surface of the primary mask opposite that on which the main mask pattern of the primary mask is formed. Alternatively, the phase grating pattern may be formed on a substrate discrete from that of the primary mask to thereby form an auxiliary mask. In this case, the auxiliary mask and the primary mask are interposed.

The phase grating pattern is formed by etching the auxiliary or primary mask substrate to form regions having depths that will induce phase shifts in light transmitted therethrough, the regions and the phase shifts corresponding to the locations and magnitudes of the phase values assigned to the subcells in the final design of the phase grating pattern.

According to the present invention, even though conventional illumination is used as an exposure light source, the light emitted by the light source can be modified to realize practically any form of illumination at the mask level. Thus, the resolution or depth of focus achieved in a photolithographic process can be improved.

BRIEF DESCRIPTION OF THE DRAWINGS

The above and other aspects, features and advantages of the present invention will become more apparent from the following detailed description of the preferred embodiments thereof made with reference to the attached drawings, in which.

DETAILED DESCRIPTION OF THE PREFERRED EMBODIMENTS

Figure 1:
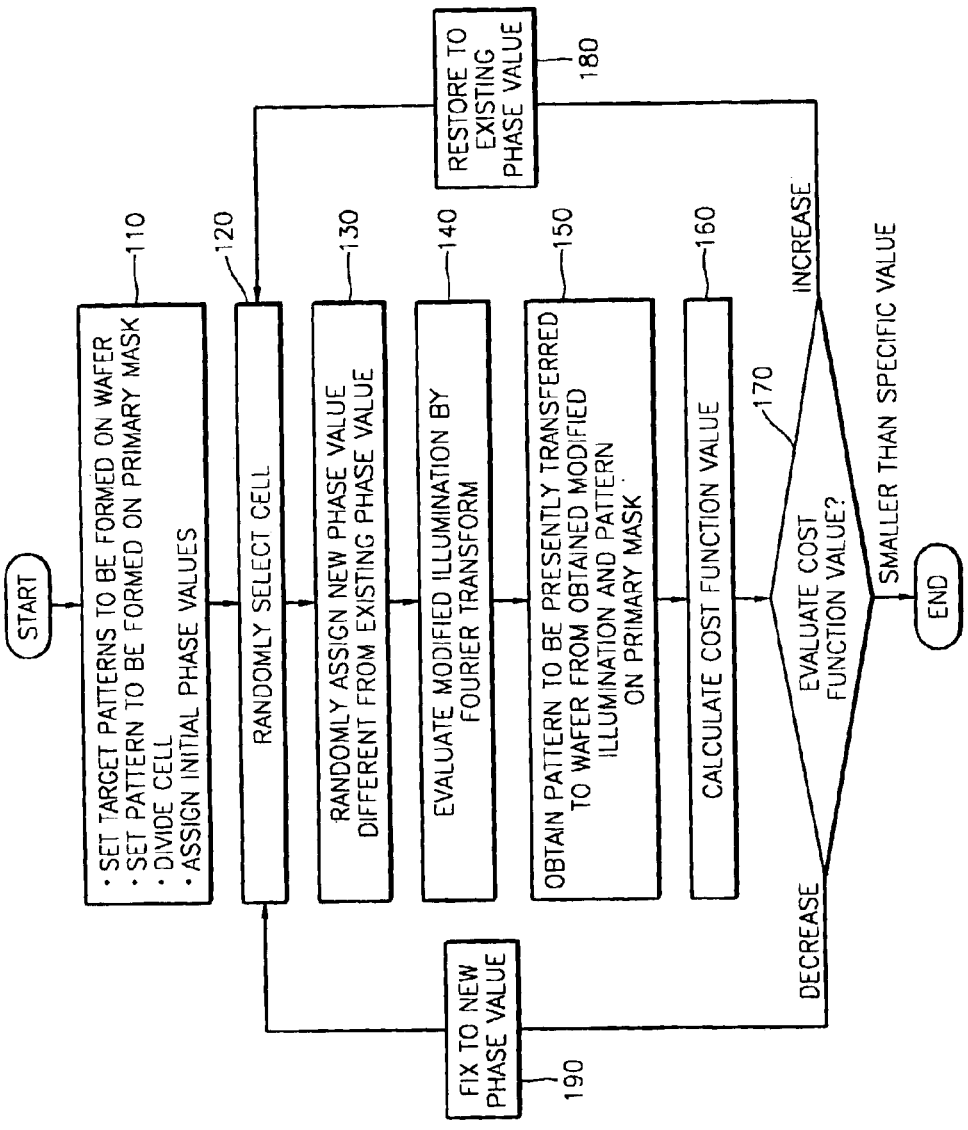
FIG. 1 is a flowchart of an embodiment of a method of designing a phase grating pattern providing modified illumination according to the present invention.

The present invention will be described in detail hereinafter with reference to the attached drawings. In the drawings, the thicknesses of layers or regions are exaggerated for clarity. Also, like reference numerals denote like elements throughout the drawings.

The present invention provides a method of designing a phase grating pattern for providing an optimum form of modified illumination to a primary mask, i.e., the mask that bears the pattern to be transcribed onto a wafer in a photolithographic process. More specifically, the modified illumination provided by the phase grating pattern causes an image of the mask pattern to be transferred to the wafer in a manner optimal for producing the desired patterns on the wafer. To this end, the phase grating diffracts light from the light source of the exposure apparatus, whereby the characteristics of the light passing therethrough are modified in a way that effects an optimal transfer of the pattern of the primary mask to the wafer.

The modified illumination in the form of diffracted light provided to the primary mask can have any shape desired by the designer and, in particular, can have a shape determined in advance as useful in enhancing the photolithographic process. For example, an octapole form of modified illumination can be produced in addition to circular, asymmetric and irregular forms. As was discussed earlier, the modified form of illumination is optimum for transferring the image of a particular pattern of the primary mask to the wafer. A design method which can realize phase grating patterns producing various forms of modified illumination optimum for transferring different mask patterns to a wafer, respectively, has great use because many different patterns must be formed on a wafer to produce a semiconductor circuit.

Figure 2:
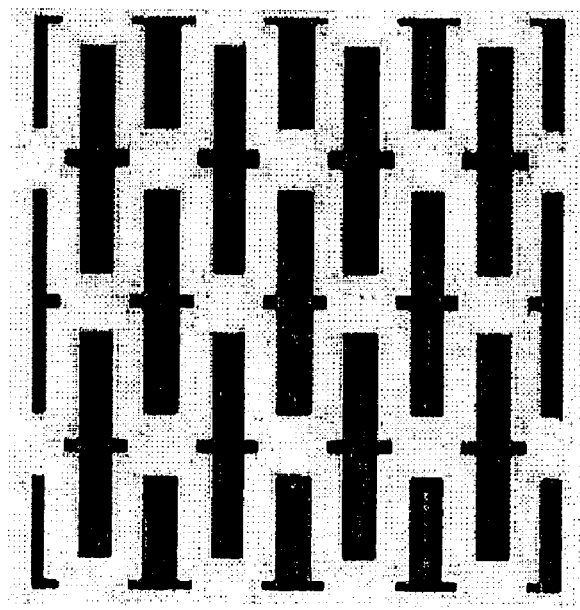
FIG. 2 is a plan view of the pattern of an active region as an example of the target pattern to be produced by photolithography using a primary mask and a phase grating pattern designed according to the method of FIG. 1.

FIG. 1 illustrates in more detail the method of designing a phase grating pattern according to the present invention. First, a target pattern to be realized on the wafer is set up in step 110. For example, the pattern shown in FIG. 2 can be set up as the target pattern to be realized on an active region of the wafer. However, patterns having shapes different from that in the active region are to be formed on the wafer in the manufacturing of the semiconductor device. In particular, a target pattern having elements of various shapes might have to be formed on the wafer, unlike the target pattern in the active region which consists of pattern elements having the same shape as shown in FIG. 2. Accordingly, the target pattern set up in step 110 may include elements having different shapes.

Referring back to step 110 in FIG. 1, the mask pattern of the primary mask can be established once the target pattern to be formed on the wafer is set up. Thereafter, a portion of the region over which the phase grating pattern is to be formed is established as a unit region. In this case, the portion of the phase grating pattern established in this unit area will be repeated throughout the entire region to realize the overall form of the phase grating pattern. This simplifies the design process. However, the phase grating pattern may be designed at once for the entire region, i.e., without the use of unit areas. Next, in step 110, the unit area is divided into subcells.

Figure 3:
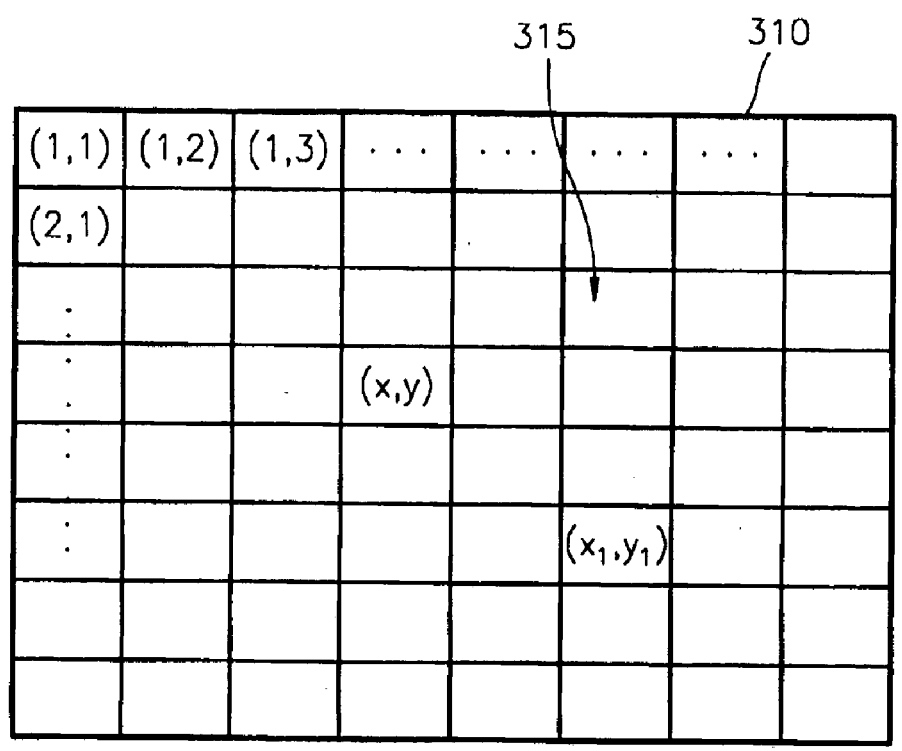
FIG. 3 is a diagram of a unit area, divided into subcells, used in the method of the present invention illustrated by the flowchart of FIG. 1.

FIG. 3 is a schematic diagram of the unit area 310 divided into subcells 315. Each of the subcells 315 may be expressed as a predetermined coordinate in space. For example, each of the subcells 315 may be designated as a respective x, y coordinate. Also, the unit area 310 may be divided into subcells 315 of an arbitrary size and number. For example, the unit area 310 may be divided into m rows and into n columns such that the unit area 310 has m×n subcells 315. Here, each of the subcells 315 is very small, e.g., has a maximum width of about 200 nm. In the case of an exposure apparatus that provides a reduction in scale of 1:4 with respect to the image formed by the exposure light, each of the subcells 315 corresponds to an image of about 50 nm that is projected onto an actual wafer.

Referring back to FIG. 1, in step 110, initial phase values are assigned to the respective subcells 315. It is preferable that the assigned initial phase values respectively indicate the degrees to which the phase of the exposure light will be shifted by portions of the phase grating corresponding to the subcells 315. If the phase grating is to induce a phase difference of 180° between respective light rays passing therethrough, initial phase values of 0° and 180° may be arbitrarily assigned to the subcells 315. However, phase values of 0°, 90°, 180°, and 270° may be assigned so that smaller phase differences can be produced if desired. Nevertheless, the present invention will be described with respect to the use of initial phase values of 0° and 180° for the sake of simplicity.

A phase value of 0° (or 180°) may be specifically assigned to each of the subcells 315 as an initial phase value. Alternatively, phase values of 0° and 180° may be randomly assigned to the subcells using a random generator. If so, an initial phase value in one of the subcells 315 at an arbitrary position (x, y) may be 0° (or 180°) whereas the same initial phase value may be assigned to the other subcells 315. Although the technique of assigning the initial phase values to the subcells 315 is related to the speed of the entire design process it does not substantially affect the result of the design process.

After the initial phase values are assigned to the subcells 315, an arbitrary subcell is selected at random from amongst the subcells 315 (step 120 of FIG. 1). For instance, the subcell at position (x, y) shown in FIG. 3 is selected.

Thereafter, a new phase value that is different from the existing phase value is assigned to the selected subcell, i.e., the subcell at position (x, y) (step 130 of FIG. 1). For example, if an initial phase value of 0° had been assigned to the subcell at position (x, y), a new phase value of 180° is assigned to the subcell at position (x, y). The new phase value is determined by randomly selecting a phase value that is different from the initial existing phase value. For instance, when the phase values to be assigned consist of 0° and 180°, a new phase value of 180° is thus assigned to the subcell at position (x, y). On the other hand, when the phase values to be assigned are 0°, 90°, 180°, and 270°, one of the three phase values other than the initial assigned phase value 0° is randomly assigned to the subcell at position (x, y). This reassigning of the phase values may be performed employing a random flip process. The particular process or technique of reassigning phase values to the subcells 315 may affect the speed at which the design process converges on the optimal design for phase grating pattern but does not affect the result of the design of the phase grating pattern.

After a new phase value is assigned to the subcell 315, a phase grating pattern based on the arrangement of the phase values for the subcells 315 in the unit area 310 is evaluated with respect to the modified illumination selected in step 110. The phase grating pattern and the form of the modified illumination produced by the phase grating pattern are related to a Fourier series. In other words, the form of the modified illumination that can be realized by a phase grating pattern can be determined by Fourier-transforming frequency values corresponding to the current phase values as correlated to the positions of the subcells to which the current phase values are assigned.

Accordingly, in order to evaluate modified illumination which can be produced using the phase grating pattern designed according to the current phase values, frequency values corresponding to the current phase values are Fourier-transformed (step 140 of FIG. 1). The Fourier transform may be a fast Fourier transform (FFT) algorithm. In other words, the form of the modified illumination that can be produced using a phase grating pattern, designed according to the current phase values, is determined using a Fourier transform. Then, the form of the modified illumination is compared with the form of the modified illumination set in the initial stage of the process. The process of evaluating the phase grating patterns using a Fourier series may employ various methods used in connection with the photolithographic process employed in the semiconductor field.

After the form of the modified illumination that can be produced by the present phase grating pattern is determined using a Fourier transform, the pattern that will be transferred to the wafer when the modified illumination is directed onto the wafer through the pattern on the primary mask is determined (step 150 of FIG. 1). In other words, the pattern to be formed on the wafer is determined from the modeling of the modified illumination provided by the phase grating pattern and the pre-established primary mask pattern. This determination may be performed using conventional lithography simulators used in the manufacturing of semiconductor devices. These simulators are operable, using a mask pattern and a model of the illumination of the mask pattern as basic parameters, to provide an aerial image of the pattern that will be transferred to the wafer.

Thereafter, the aerial image, i.e., the pattern that will be transferred to the wafer, is evaluated to determine if it corresponds to the target pattern set in step 110 of FIG. 1. First, a cost function value is calculated (step 160). The cost function value represents the difference between the simulated result of the pattern that will be transferred to the wafer using the primary mask illuminated by the modified form of the illumination provided by the current phase grating pattern, and the target pattern. The cost function value may be calculated using various values representing the phase grating pattern, the mask pattern, and the target pattern. For example, the cost function may be one that compares the critical dimension (CD) of the pattern transferred to the wafer with the CD of the target pattern. Next, the calculated cost function value is evaluated in step 170.

Alternatively, the cost function may offer a comparison between the image of the pattern on the defocused wafer and the image of the target pattern. For example, the comparison may be performed using a normalized image log slope (NILS) provided by conventional lithography simulation. The current form of the modified illumination can be easily optimized by comparing the image on the defocused wafer and the image of the target pattern in this way, so that the time for optimizing the design of the phase grating pattern can be minimal.

The current cost function value is compared with the previously calculated cost function value and is evaluated (step 160 in FIG. 1). If the current cost function value is less than a specific value, the design process stops because a phase grating pattern made on the basis of the current phase values is regarded as one that will produce the desired modified illumination. However, if the current cost function value is greater than the specific value, steps 120 through 170 in FIG. 1 are repeated.

As described above, in an attempt to converge the new cost function value, obtained as the result of repeating the above-described steps, towards one that will be equal to or less than a specific predetermined value, the phase value assigned to the subcell randomly selected in step 120 is changed. In the current example, a new phase value of 180°, not the original value of 0°, is assigned to the subcell at position ($x_1$, $y_1$) in step 130. However, if the cost function value calculated in step 160 of FIG. 1 is higher than the previously calculated cost function value, the subcell at position ($x_1$, $y_1$) is assigned its original phase value of 0° when the process returns to step 120 (step 180 in FIG. 1). On the other hand, of course, if the cost function value calculated in step 160 is determined in step 170 to be less than the previous cost function value but still greater than the specific predetermined value, the phase value of the subcell at position ($x_1$, $y_1$) is fixed at 180° (step 190 in FIG. 1) when the process returns to step 120.

As steps 180 and 190 are continuously performed in the loop of the process of sequentially repeating step 120 (randomly selecting a subcell) through step 170 (evaluating the cost function value), the cost function value will gradually converge on (decrease to) a specific predetermined value, e.g., zero. However, it may be difficult to get the cost function value to converge exactly to zero. Accordingly, the specific predetermined value, which is a basis of determining when the process is to be stopped, may be set to a value corresponding to a point of convergence of a curve representing changes in the cost function value and the number of times the process (loop) is repeated.

Figure 4:
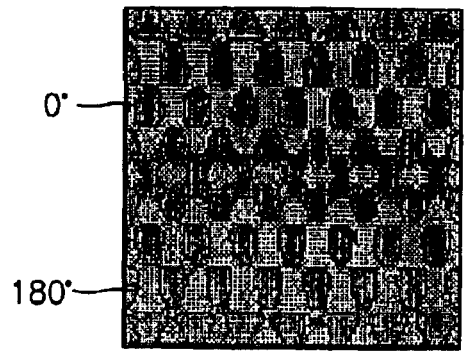
FIG. 4 is a plan view of a phase grating pattern obtained by randomly assigning phase values of 0° or 180° to the subcells in carrying out the method according to the flowchart of FIG. 1.

An example of a final phase grating pattern is shown in FIG. 4. Here, the phase values assigned to the lower level cells are limited to 0° and 180°.

FIG. 4 illustrates the final phase grating pattern designed according to the present invention when phase values selected from the group consisting of 0° and 180° are initially assigned to the subcells 315. The phase grating pattern of FIG. 4 occupies only a unit region. Thus, the phase grating itself is formed by repeating the phase grating pattern designed for the unit region.

Figure 5:
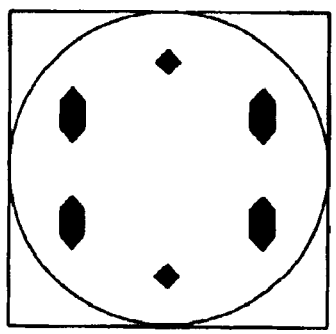
FIG. 5 is a schematic diagram of a Fourier-transform spectrum corresponding to the phase grating pattern shown in FIG. 4.

FIG. 5 shows a Fourier-transform spectrum with respect to the phase grating pattern of FIG. 4, that is an illustration of the frequency function value resulting from performing of a Fourier transform function on a model of the phase grating pattern of FIG. 4.

Figure 6:
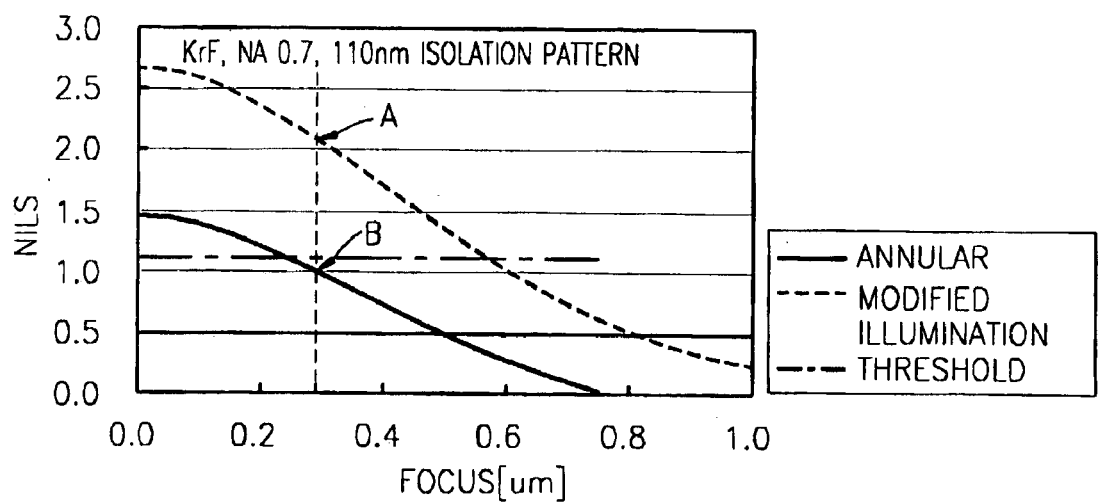
FIG. 6 is a graph illustrating a simulated aerial image of a wafer when an exposure system producing the modified illumination characterized by the spectrum shown in FIG. 5 is used.

A means for evaluating whether the modified form of illumination corresponding to the spectrum of FIG. 5 is optimum for producing the target pattern of FIG. 2 is illustrated in FIG. 6. Specifically, FIG. 6 is a graph illustrating a simulation of the aerial image of the pattern formed on the wafer when the modified illumination is used. The graph of FIG. 6 is obtained from a lithography simulation based on forming the target pattern of FIG. 2 using the modified illumination producing the spectrum of FIG. 5. In this simulation, KrF is used for the exposure light, and the target pattern of FIG. 2 are to be provided in active regions, which are separated by an isolation region having a width of 110 nm. In addition, the numerical aperture of the exposure process is set to 0.7. An annular form of the modified illumination is used for comparison with the modified illumination having the spectrum shown in FIG. 5.

Considering the values of the NILS shown in FIG. 6, a phase grating pattern producing the form of modified illumination having the spectrum shown in FIG. 5 provides a process margin that is significantly larger than can be realized by the prior art. For a particular depth of focus, the focus margin that can be realized by annular modified illumination over a threshold is only 0.2 $\mu$m; however, the focus margin that can be realized by producing the modified illumination having the spectrum of FIG. 5 is about 0.6 $\mu$m. In other words, the modified illumination that can be produced using a phase grating pattern designed according to the present invention can realize significantly improved depth of focus.

Figure 7:
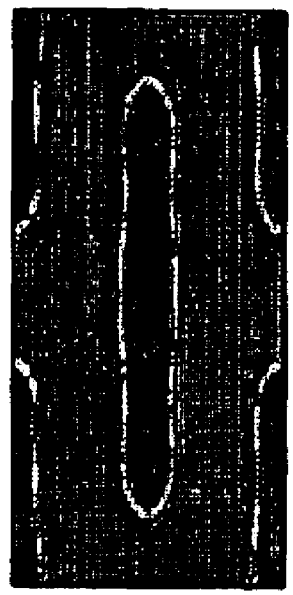
FIG. 7 illustrates the aerial image at point A of FIG. 6.
Figure 8:
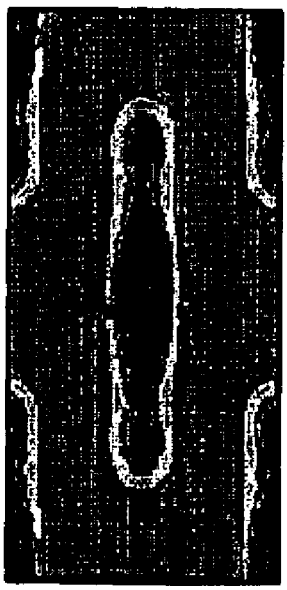
FIG. 8 illustrates the aerial image at point B of FIG. 6.

The differences in the depths of focus and exposure amounts can be confirmed from simulated aerial images of the wafer. FIG. 7 illustrates the aerial image at point A of FIG. 6, and FIG. 8 illustrates the aerial image at point B of FIG. 6. A comparison of the image of FIG. 7 with the image of FIG. 8 clearly reveals that the modified illumination produced by a phase grating pattern designed, according to the present invention based on the target pattern shown in FIG. 2, is indeed better for producing the target patterns of FIG. 2 than the form of illumination that resulted in the aerial image of FIG. 8.

The process for comparing the image formed on the defocused wafer with the target image may be carried out to reduce the time required for optimizing the modified illumination in the design process. For example, if the process of comparing the image on the defocused wafer with the target image is performed using the information shown in FIG. 6 when the cost function value is evaluated in step 170, the present form of the modified illumination can be efficiently optimized.

When the target pattern to be realized on the wafer is formed of one kind of pattern element, or when the target pattern is to be repeated in the several regions, a photo mask system according to the present invention may be realized by designing the phase grating pattern for only a unit region of the primary mask, and then repeating the phase grating pattern over the entire region of the mask. Nevertheless, patterns having different shapes often need to be produced on various regions of the wafer, respectively, when manufacturing a semiconductor device. In other words, different target patterns may be set up in different regions of the wafer. In this case, the above-described method for designing the phase grating can be performed separately for each of the target regions of the wafer so that phase grating patterns optimum for each of the target regions are formed. These phase grating patterns corresponding to partial phase gratings, respectively, are arranged over the entire region of the primary mask in correspondence with the target regions on the wafer so that modified illumination optimum for each of the target regions can be provided by one photo mask.

Figure 9:
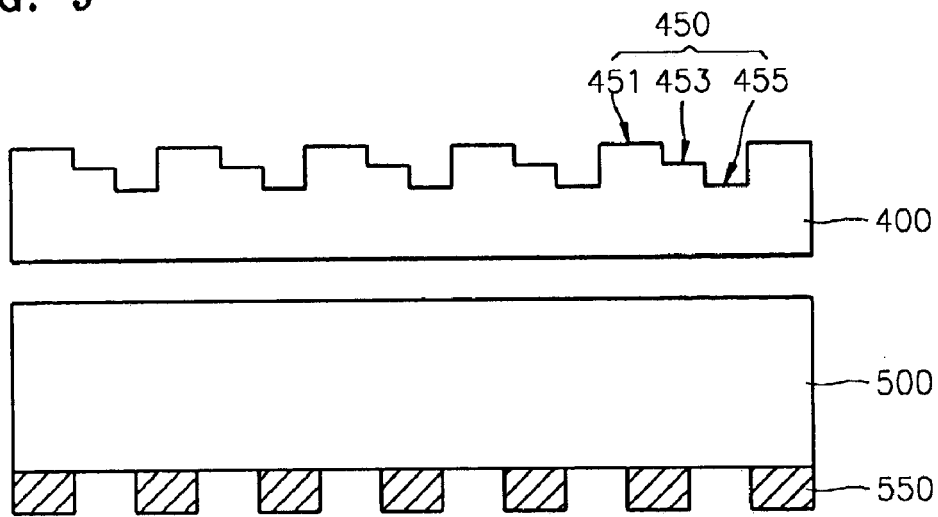
FIGS. 9 through 11 are cross-sectional views of respective photomask systems according to the present invention.
Figure 10:
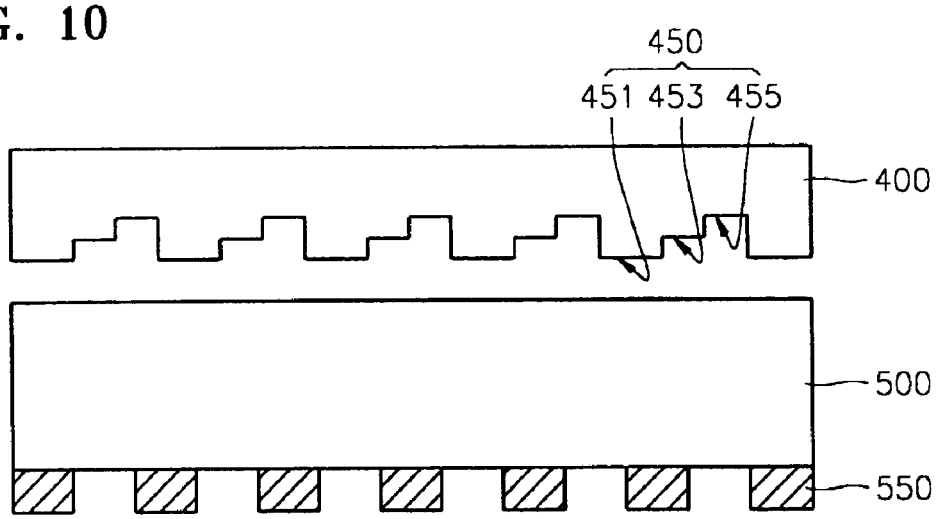

A phase grating pattern designed according to the above-described process may be produced on a surface of an auxiliary mask, as shown in FIGS. 9 and 10.

Referring to FIG. 9, an auxiliary mask 400 having a phase grating pattern 450 designed according to the steps shown in FIG. 1 may be employed in a mask system used in the photolithographic process. The phase grating pattern 450 is formed on one surface of the auxiliary mask 400. The phase values that were finally assigned to the subcells are realized as respective depths of recesses formed in the auxiliary mask 400 by etching. For example, a first area 451 of the phase grating pattern 450 is realized as an unetched area corresponding to a phase value of 0°, a second area 453 of the phase grating pattern 450 is realized as an area etched to a predetermined depth corresponding to a phase value of 90°, and a third area 455 of the phase grating pattern 450 is realized an area etched to a different predetermined depth corresponding to a phase value of 180°.

Also, in the example shown in FIG. 9, the surface of the auxiliary mask 400 bearing the phase grating pattern 450 is arranged to face in a direction opposite to that of a surface of a primary mask 500 bearing the primary mask pattern 550 to be transferred to a substrate. The phase grating pattern 450 of the auxiliary mask 400 serves to modify the illumination transmitted to the primary mask pattern 550 from the light source of the exposure apparatus. Thus, if the phase grating pattern 450 of the auxiliary mask 400 is designed so as to produce the illumination as shown in FIG. 5, the primary mask pattern 500 is irradiated with the illumination.

FIG. 10 illustrates a second example of the photo mask according to the embodiment of the present invention. Referring to FIG. 10, the phase grating pattern 450 of the auxiliary mask 450 faces in the same direction as the surface of the primary mask 500 bearing the primary mask pattern 550.

Figure 11:
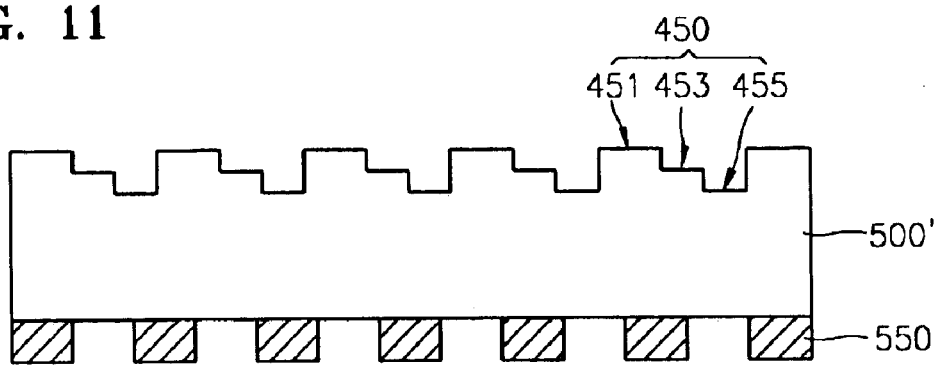

FIG. 11 illustrates a third example of a photo mask according to the present invention. Referring to FIG. 11, the phase grating pattern 450 may be realized on the surface of a primary mask 500' opposite to the surface on which the primary mask pattern 550 of the primary mask 500' is formed. In other words, the phase grating pattern may be integrated with the primary mask so that it forms a single body with the primary mask. In this case, similar to the previous embodiments, the phase grating pattern 450 is produced through a process of selectively etching the back surface of the primary mask 500'.

According to the present invention, the modified illumination optimum for producing target patterns on a wafer can be provided at the mask system level. Accordingly, the resolution and the defocus for the mask pattern to be transferred can be improved without the need to change a light exposure system comprising a conventional source of illumination. Thus, the process margin of the semiconductor manufacturing process can also be increased.

Finally, although the present invention has been particularly shown and described with reference to the preferred embodiments thereof, it will be understood by those of ordinary skill in the art that various changes in form and details may be made thereto without departing from the true spirit and scope of the present invention as defined by the appended claims.

What is claimed is:

1. A method of designing a phase grating pattern, the method comprising:

selecting a target pattern to be formed on a wafer via a photolithographic process;

selecting a mask pattern of a primary mask, and which mask pattern is to be transcribed onto the wafer in the photolithographic process;

dividing an area, corresponding to at least one portion of the area of the primary mask, into a plurality of subcells;

arbitrarily assigning one of a plurality of phase values to the subcells, whereby each of the subcells is provided with an initial one of the phase values, each of the phase values representing a respective phase shift that exposure light of the photolithographic process will undergo by being transmitted through a region of the phase grating pattern corresponding to the subcell;

randomly selecting one of the subcells, and assigning one of the plurality of phase values to the selected one of the subcells, and repeating said random selecting of respective ones of the subcells and said assigning of one of the phase values thereto such that a plurality of arrangements of phase values assigned to the subcells are produced; and evaluating the plurality of arrangements of phase values with respect to the propensity of a phase grating pattern, based on an arrangement of the phase values, to produce a form of modified illumination for the primary mask that is optimal for producing the target pattern being on the wafer when an exposure light is directed onto the mask via the phase grating pattern in the photolithographic process.

2. The method of claim 1, wherein the area divided is only a unit area of that which is to be occupied by the entire phase grating pattern, and the portion of the phase grating pattern designed for said unit area is repeated to provide the final design of the phase grating pattern.

3. The method of claim 1, wherein the area divided is only a unit area of that which is to be occupied by the entire phase grating pattern, and the portion of the phase grating pattern designed for said unit area is repeated to provide the final design of the phase grating pattern.

4. The method of claim 1, wherein said arbitrarily assigning one of a plurality of phase values to the subcells comprises assigning the same one of the phase values initially to all of the subcells.

5. The method of claim 1, wherein said arbitrarily assigning one of a plurality of phase values to the subcells comprises assigning each of the subcells a phase value selected from among the group consisting of phase values of 0° and 180°.

6. The method of claim 1, wherein said arbitrarily assigning one of a plurality of phase values to the subcells comprises assigning each of the subcells a phase value selected from among the group comprising phase values of 0°, 90°, 180°, and 270°.

7. The method of claim 1, wherein said evaluating the arrangement of the phase values comprises producing an aerial image of the wafer based on the wafer undergoing a photolithographic process using the form of the modified illumination produced by a phase grating pattern designed according to the current arrangement of the phase values, and evaluating whether said aerial image corresponds to the image of said target pattern to be formed on the wafer.

8. The method of claim 7, wherein the aerial image is obtained as a defocused image.

9. A method of designing a phase grating pattern, the method comprising:
 (a) selecting target patterns, having different shapes, to be formed on various regions of a wafer, respectively, via a photolithographic process;
 (b) dividing an area corresponding to that of the primary mask, and which area is to be occupied by the phase grating pattern, into a plurality of areas corresponding to said various regions of the wafer;
 (c) dividing a respective one of said plurality of areas into a plurality of subcells;
 (d) arbitrarily assigning one of a plurality of phase values to the subcells, whereby each of the subcells is provided with an initial one of the phase values, each of the phase values representing a respective phase shift that exposure light of the photolithographic process will undergo by being transmitted through a region of the phase grating pattern corresponding to the subcell;
 (e) randomly selecting one of the subcells, and assigning one of the plurality of the phase values to the selected one of the subcells, and repeating said random selecting of respective ones of the subcells and said assigning of one of the phase values thereto such that a plurality of arrangements of phase values assigned to the subcells are produced;
 (f) evaluating the arrangements of phase values with respect to the propensity of a phase grating pattern, based on an arrangement of the phase values, to be optimal for use in producing the target pattern; and
 (g) sequentially performing (b) through (f) for each of the other ones of said plurality of areas corresponding to said various regions of the wafer; and
 (h) correspondingly arranging the phase grating patterns obtained as the result of (g) in said plurality of areas corresponding to said various regions of the wafer at which the target patterns are to be produced.

10. A method of designing a phase grating pattern, the method comprising:
 selecting a target pattern to be formed on a wafer via a photolithographic process;
 selecting a mask pattern of a primary mask and which mask pattern is to be transcribed onto the wafer in the photolithographic process;
 dividing an area, corresponding to at least one portion of the area of the primary mask, into a plurality of subcells;
 arbitrarily assigning one of a plurality of phase values to the subcells, whereby each of the subcells is provided with an initial one of the phase values, each of the phase values representing a respective phase shift that exposure light of the photolithographic process will undergo by being transmitted through a region of the phase grating pattern corresponding to the subcell;
 (a) randomly selecting one of the subcells;
 (b) changing the phase value previously assigned to the selected one of the subcells to a new one of the phase values that is different from the phase value that had been last assigned thereto, whereby a new arrangement of the phase values assigned to the subcells is produced;
 (c) using a Fourier-transform function to obtain a Fourier-transform function value representative of the form of modified illumination that will be produced by a phase grating pattern based on the new arrangement of phase values that are assigned to the subcells;
 (d) producing an aerial image of what the wafer would look like upon undergoing a photolithographic process using the form of the modified illumination represented by the Fourier-transform function value;
 (e) obtaining a cost function value representing a difference between the aerial image and the target pattern to be formed on the wafer;
 (f) evaluating the cost function value to determine whether the new arrangement of the phase values assigned to the subcells corresponds to a modified form of illumination that will produce the target pattern in the photolithographic process; and
 (g) repeating steps (a)–(f) until a new arrangement of the phase values corresponds to a phase grating pattern that will produce said form of the modified illumination that will produce the target pattern in the photolithographic process.

11. The method of claim 10, wherein said evaluating of the cost function value in (f) includes comparing a current cost function value obtained in (d) as the result of said repeating of (a)–(e) to the previous cost function value obtained in (d), and further comprising (g) maintaining the assignment of said new one of the phase values to the selected one of the subcells throughout the remainder of times that (a)–(e) are repeated if the current cost function value is less than the previous cost function value, and changing the phase value assigned to the selected one of the subcells to the phase value previously assigned to the selected one of the subcells if the current cost function value is greater than the previous cost function value.

12. The method of claim 10, wherein said arbitrarily assigning one of a plurality of phase values to the subcells comprises randomly assigning the phase values to the subcells.

13. The method of claim 10, wherein said arbitrarily assigning one of a plurality of phase values to the subcells comprises assigning the same one of the phase values initially to all of the subcells.

14. The method of claim 10, wherein said arbitrarily assigning one of a plurality of phase values to the subcells comprises assigning each of the subcells a phase value selected from among the group consisting of phase values of 0° and 180°.

15. The method of claim 10, wherein said assigning one of the plurality of the phase values to the selected one of the subcells comprises randomly assigning to the selected subcell one of a remaining number of phase values that are different from the phase value that had been last assigned thereto.

16. The method of claim 10, wherein the aerial image is produced as a defocused image.

17. A method of manufacturing a photo mask, the method comprising:

providing a primary mask bearing a main pattern the image of which is to be transcribed onto a substrate using a photolithographic process in which the substrate is irradiated with light emitted by a light source and directed through the main mask;

designing a phase grating pattern that will modify the illumination of the main pattern with the light from the light source such, said designing comprising:

selecting a target pattern to be formed on a wafer via the photolithographic process, dividing an area, corresponding to at least one portion of the area of the primary mask, into a plurality of subcells, arbitrarily assigning one of a plurality of phase values to the subcells, whereby each of the subcells is provided with an initial one of the phase values, each of the phase values representing a respective phase shift that exposure light of the photolithographic process will undergo by being transmitted through a region of the phase grating pattern corresponding to the subcell, (a) randomly selecting one of the subcells, (b) changing the phase value previously assigned to the selected one of the subcells to a new one of the phase values that is different from the phase value that had been last assigned thereto, whereby a new arrangement of the phase values assigned to the subcells is produced, (c) using a Fourier-transform function to obtain a Fourier-transform function value representative of the form of modified illumination that will be produced by a phase grating pattern based on the new arrangement of phase values that are assigned to the subcells, (d) producing an aerial image of what the wafer would look like upon undergoing a photolithographic process using the form of the modified illumination represented by the Fourier-transform function value, (e) obtaining a cost function value representing a difference between the aerial image and the target pattern to be formed on the wafer, (f) evaluating the cost function value to determine whether the new arrangement of the phase values assigned to the subcells corresponds to a modified form of illumination that will produce the target pattern in the photolithographic process, and (g) repeating steps (a)–(f) until a new arrangement of the phase values corresponds to a phase grating pattern that will produce said form of the modified illumination that will produce the target pattern in the photolithographic process; and producing a mask system in which a phase grating pattern inducing phase shifts in light transmitted therethrough, corresponding to the final arrangement of the phase values, is integrated with the primary mask.

18. The method of claim 17, wherein said producing a mask system comprises forming the phase grating pattern on one surface of a substrate of the primary mask opposite another surface of the primary mask that bears the main pattern the image of which is to be transcribed.

19. The method of claim 18, wherein said forming the phase grating pattern comprises etching said one surface of the substrate of the primary mask to form a series of recesses therein, whereby the phase grating pattern and said main pattern are parts of unitary body.

20. The method of claim 17, wherein said producing a mask system comprises forming the phase grating pattern on an auxiliary substrate discrete from said primary mask to thereby form an auxiliary mask, and juxtaposing the auxiliary mask and the primary mask.

* * * * *